United States Patent [19]
Walther et al.

[11] Patent Number: 5,750,249
[45] Date of Patent: *May 12, 1998

[54] GALVANICALLY COMPATIBLE CONDUCTIVE FILLER AND METHODS OF MAKING SAME

[75] Inventors: James F. Walther, Mountain Lakes; Robert J. Teichmann, Towaco; Andrew M. Wasowicz, West Paterson, all of N.J.

[73] Assignee: Potters Industries, Inc., Parsippany, N.J.

[*] Notice: The term of this patent shall not extend beyond the expiration date of Pat. No. 5,175,056.

[21] Appl. No.: 955,906

[22] Filed: Feb. 5, 1993

Related U.S. Application Data

[63] Continuation-in-part of Ser. No. 535,365, filed as PCT/US9104014, published as WO91/18740, Pat. No. 5,175,056.

[51] Int. Cl.⁶ .................................................. B32B 5/16
[52] U.S. Cl. .................. 428/328; 252/512; 252/513; 252/516; 252/518; 252/519; 252/520; 427/216; 427/217; 427/248.1; 427/250; 428/329; 428/403; 428/404; 428/406; 428/701; 428/702
[58] Field of Search .................................. 428/403, 404, 428/406, 328, 329, 699, 701, 702; 252/512, 513, 516, 519, 518, 520; 427/216, 217, 248, 1, 250, 437; 204/140

[56] References Cited

U.S. PATENT DOCUMENTS

| | | | |
|---|---|---|---|
| 2,299,813 | 10/1942 | Franks | 285/139 |
| 2,477,267 | 7/1949 | Robinson | 174/35 |
| 2,771,380 | 11/1956 | Coleman et al. | 117/227 |
| 3,140,342 | 7/1964 | Ehrreich et al. | 174/35 |
| 3,202,488 | 8/1965 | Ehrreich et al. | 29/192 |
| 3,562,124 | 2/1971 | Leon et al. | 204/128 |
| 3,583,930 | 6/1971 | Ehrreich et al. | 252/514 |
| 3,609,104 | 9/1971 | Ehrreich et al. | 252/511 |
| 3,687,724 | 8/1972 | Keith et al. | 117/230 |
| 3,837,894 | 9/1974 | Tucker, Jr. | 428/432 X |
| 3,882,507 | 5/1975 | Trimble et al. | 252/62.55 |
| 3,892,600 | 7/1975 | Smeggil et al. | 148/31.57 |
| 4,092,459 | 5/1978 | Deffeyes et al. | 428/403 |
| 4,119,763 | 10/1978 | Blair | 428/563 |
| 4,137,361 | 1/1979 | Deffeyes et al. | 428/328 |
| 4,218,507 | 8/1980 | Deffeyes et al. | 428/328 |
| 4,400,432 | 8/1983 | Buxbaum et al. | 428/403 |
| 4,434,541 | 3/1984 | Powers, Jr. | 428/328 |
| 4,507,359 | 3/1985 | Powers, Jr. | 428/328 |
| 4,624,798 | 11/1986 | Gindrup et al. | 428/403 X |
| 4,678,716 | 7/1987 | Tzeng | 428/551 |
| 4,711,814 | 12/1987 | Teichmann | 428/403 |

(List continued on next page.)

OTHER PUBLICATIONS

Conductive Elastomer Gasket Design, EMI Sheilding Engineering Handbook, Chomerics, Inc., Woburn, MA, 25:25-26 (1985).

CRC Handbook of Chemistry and Physics, 56th Edition (Weast, Ed.), D51-58 (1975-1976).

M. Alonso, Mechanism Of The Combined Coating-Mechanofusion Processing Of Powders, Powder Technology, 59:45-52 (1989).

(List continued on next page.)

*Primary Examiner*—H. Thi Le
*Attorney, Agent, or Firm*—George B. Snyder; Curtis, Morris & Safford, P.C.

[57] ABSTRACT

Composite particles suitable as conductive filler for electrically conductive compositions which can be used as gaskets, caulking and plastics, for example. The compositions are, useful as EMI shielding and electrostatic charge dissipation materials. Methods of making and using the foregoing are also covered.

50 Claims, 8 Drawing Sheets

(5 of 13 Drawing(s) in Color)

U.S. PATENT DOCUMENTS

| | | | |
|---|---|---|---|
| 4,725,508 | 2/1988 | Rangaswamy et al. | 428/570 |
| 4,769,280 | 9/1988 | Powers | 428/328 |
| 4,882,224 | 11/1989 | Moro et al. | 428/403 |
| 5,021,368 | 6/1991 | Hoffman et al. | 501/92 |
| 5,026,605 | 6/1991 | Kitamura et al. | 428/403 |
| 5,034,157 | 7/1991 | Merrell et al. | 252/512 |
| 5,175,056 | 12/1992 | Walther et al. | 428/403 |

OTHER PUBLICATIONS

T. Yokoyama et al., The Angmill Mechanofusion System And Its Applications, Kona, No. 5, 59–68 (1987).

An Introduction To Powder Modification Technology, Powder and Bulk Engineering, 50–54 (Feb., 1990).

J.S. Benjamin, Mechanical Alloying, Scientific American, 234:40–48 (1976).

B. Fultz et al., Mechanical Alloying Of Fe And V Powders: Intermixing And Amorphous Phase Formation, J. Mater. Res. 4(6): 1450 (1989).

Military Specification–Shielding Gasket, Electronic, Elastomer, EMI/RFI, General Specification Mil—G–83528 (Apr. 1, 1988).

E.J. Carlson, Less Corrosive EMI Shielding Materials for Arrow Space Applications, Item, 20–34 (1990).

D.M. Bigg et al., Molded Composites as EMI Shields, Industrial Research/Development, 103–105 (Jul. 1979).

H.L. El–Amin, EMI Shielding–Part II Conductive Additives, Plastics Technology, 67–72 (Aug. 1981).

1

GALVANICALLY COMPATIBLE CONDUCTIVE FILLER AND METHODS OF MAKING SAME

This application is a continuation-in-part of application Ser. No. 07/535,365, filed as PCT/US91/04014 published as WO91/18740 now U.S. Pat. No. 5,175,056.

FIELD OF THE INVENTION

The present invention relates to conductive particles, especially conductive particles adapted to be galvanically compatible with a metal or metal alloy, i.e., galvanically compatible conductive filler. The invention also relates and to new materials, e.g., gaskets, caulking compounds, adhesives, coatings, etc., which incorporate such conductive particles, i.e., the galvanically compatible filler, and which are useful for electromagnetic interference (EMI) shielding or for electrostatic charge dissipation.

Several publications, the disclosures of which are incorporated by reference, are cited to describe more fully the state of the art to which this invention pertains. The publications are identified in the following text by use of Arabic numerals in parentheses. Full citations for these references, to which the textual identifications are keyed, are found immediately preceding the claims.

BACKGROUND OF THE INVENTION

Conductive materials which are, to some degree, plastic would be useful in various technological applications.

For example, conductive materials can be utilized as conductive filler in relatively lightweight shielding for electronic devices. This shielding is used to protect sensitive electronic devices from relatively high levels of electromagnetic radiation in the environment resulting from the increased utilization of electronic equipment.

More specifically, while protection can be provided by metallic shields, the substantial weight of solid metal shields, as well as their relatively high cost makes their use impractical. Moreover, housings for electronic components are often constructed in two or more parts to allow for ready access to the electronic components. Metallic shields are ineffective for sealing gaps between the parts of such housings, and therefore are not suited for protecting the components within from adverse atmospheric conditions. Accordingly, it is desirable to provide an EMI shield which is relatively lightweight and sufficiently plastic to act as a sealant, to protect housed electronic components from the elements as well as to protect the components from EMI.

The basic requisite for such EMI shielding material is that it conduct electricity. Electrical conductivity can be imparted to plastics via incorporation of conductive fillers into the plastic matrix. This would seem in principle to be an acceptable solution. However, in practice there is a significant problem.

On the one hand, typical conductive fillers contain silver, nickel or copper. On the other hand, the housings for electronic components are typically made of aluminum. Because silver, nickel and copper are more noble than aluminum, these metals will set up a galvanic cell in contact with aluminum in the presence of moisture. In other words, there is an electrochemical potential difference between aluminum and the conductive fillers. This results in accelerated corrosion of the aluminum housing, which is referred to as galvanic corrosion (1). A filler which does not give rise to galvanic corrosion is needed.

Another application for conductive filler is incorporation in plastic material to provide an electrostatic charge dissipation composition. Such a composition can be deposited on, for instance, a metal surface so that, when a person carrying a static charge touches the coated surface, the charge is bled off by the conductive material in the composition, rather than discharged in a spark. Of course, the plasticity of the material is useful in conforming it to the surface's configuration, etc. But, as will be appreciated, the same galvanic corrosion difficulties as discussed above are attendant to use of electrostatic charge dissipation compositions containing conventional conductive fillers.

Ideally, to avoid galvanic corrosion, one could make the conductive filler from the same metal as that of which the housing is composed. Thus, in the case of an aluminum housing, aluminum powder would be used as a filler. However, the use of aluminum powder is disadvantageous in that the natural oxide film on the aluminum particles prevents the passage of electricity owing to the high resistivity of the oxide.

Provision of a fill material which is both suitably conductive and does not promote galvanic corrosion would be a significant advance.

OBJECTS OF THE INVENTION

It is therefore an object of the present invention to provide an electrically conductive composite material which is galvanically compatible with a given metal.

It is another object of the present invention to provide a material suitable for EMI shielding or electrostatic charge dissipation applications, which incorporates an electrically conductive composite material as filler that is galvanically compatible with a given metal.

It is another object of the present invention to provide an EMI shielding material which incorporates a plurality of electrically conductive composite particles which are galvanically compatible with a given metal (e.g., constituting the housing for electronic components).

It is a further object of the present invention to provide an EMI shielding material which is simultaneously capable of protecting electrical components contained within a housing from adverse atmospheric conditions and to reduce substantially galvanic corrosion of the housing.

It is yet another object of the present invention to provide methods for making and using the aforementioned materials, including providing EMI shielding between two surfaces.

Various other objects, advantages and features of the invention will become readily apparent from the ensuing description.

SUMMARY OF THE INVENTION

In one aspect, the invention is a composite particle suitable for incorporation in a composition, which composition is galvanically compatible in respect of a metallic material, said particle comprising in combination (1) a core material (a) which is metallic and has an analysis substantially the same as that of said metallic material, (b) which is substantially electrochemically inert in respect of said metallic material, or (c) which includes a first portion having an analysis substantially the same as that of said metallic material and a second portion which is substantially electrochemically inert in respect of said metallic material, and (2) an electrically conductive material bonded to the core material, which electrically conductive material is substantially inert to participation in or catalysis of cathodic reaction involving the electrochemical reduction of molecular oxygen or water. In a further aspect, the invention comprises a plurality, typically a multiplicity, of such composite particles.

In another aspect, the invention is a electrically conductive composition which is galvanically compatible with a metallic material, said composition comprising in combination (a) a binder matrix; and (b) a plurality of composite particles dispersed throughout said binder matrix, each of said particles comprising in combination a core material (i) which is metallic and has an analysis substantially the same as that of said metallic material, (ii) which is substantially electrochemically inert in respect of said metallic material, or (iii) which includes a first portion having an analysis substantially the same as that of said metallic material and a second portion which is substantially electrochemically inert in respect of said metallic material; and an electrically conductive material bonded to the core material, which electrically conductive material is substantially inert to participation in or catalysis of cathodic reaction involving the electrochemical reduction of molecular oxygen or water. Typically, the composite particles are incorporated in an amount sufficient to provide electrical conductivity; this can be derived empirically, without undue experimentation, by the skilled artisan once equipped with the teachings herein.

Yet another aspect of the invention is directed to a method for preparing a composite particle suitable for incorporation in a composition which is galvanically compatible in respect of a metallic material, which method comprises contacting (a) a core material (i) which is metallic and has an analysis substantially the same as that of said metallic material, (ii) which is substantially electrochemically inert in respect of said metallic material, or (iii) which includes a first portion having an analysis substantially the same as that of said metallic material and a second portion which is substantially electrochemically inert in respect of said metallic material, with (b) an electrically conductive material that is substantially inert to participation in or catalysis of cathodic reaction involving the electrochemical reduction of molecular oxygen or water, said contact being effected under conditions such that said core material and said electrically conductive material are bonded.

In still another aspect, the invention is directed to a method for preparing an electrically conductive composition, which is galvanically compatible in respect of a metallic material, which method comprises admixing a binder matrix with a plurality of composite particles so as to disperse said particles throughout said matrix, each of said composite particles comprising in combination (a) a core material (i) which is metallic and has an analysis substantially the same as that of said metallic material, (ii) which is substantially electrochemically inert in respect of said metallic material, or (iii) which includes a first portion having an analysis substantially the same as that of said metallic material and a second portion which is substantially electrochemically inert in respect of said metallic material, and (b) an electrically conductive material that is substantially inert to participation in or catalysis of cathodic reaction involving the electrochemical reduction of molecular oxygen or water; said core material and said electrically conductive material being bonded.

The compositions of the invention can be used as, among other things, EMI shielding, for electrostatic charge dissipation applications, and as corrosion protection materials (in the cases discussed hereinafter), and may also be useful as shielding or protection for humans against one or more various forms of electromagnetic radiation.

Various other objects, advantages and features of the invention will become readily apparent from the ensuing description of the invention, when read with reference to the accompanying figures wherein:

BRIEF DESCRIPTION OF THE DRAWINGS

FIGS. 5 and 8 are X-ray energy dispersive spectra of composite particles according to the invention.

DESCRIPTION OF CERTAIN PREFERRED EMBODIMENTS OF THE INVENTION

Figure 1A:
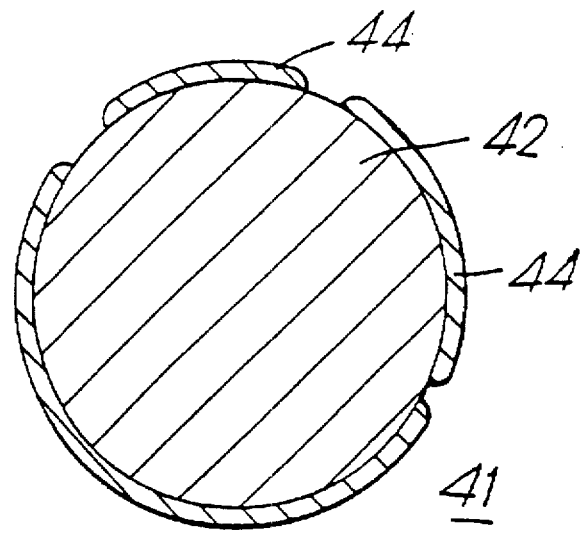
FIGS. 1A through 1E are schematic representations of certain embodiments of the composite particles according to the invention (the components as illustrated are not necessarily proportionately sized vis-a-vis one another)

The term "particle" as used herein refers to a small quantity of matter which can be spherical or irregular in shape. Advantageously, particles in accordance with the invention are irregular in shape.

The core material of a composite particle in accordance with the invention can be selected so that it is galvanically compatible with a given metallic material, such as a surface or the like. The core material can be chosen from a wide range of alternatives, depending upon which one accommodates the contemplated application. Thus, the core material can (a) have an analysis which is substantially the same as that of a metallic material with which an electrically conductive composition containing the core material would come in contact during use, (b) be substantially electrochemically inert in respect of the metallic material, or (c) comprise a combination of a first portion having an analysis substantially the same as that of the aforementioned metallic material and a second portion which is substantially electrochemically inert in respect of the metallic material.

The term "galvanically compatible" as used herein refers to the characteristic of resisting galvanic corrosion with respect to a metallic material. That is, it refers to the characteristic of being substantially inert to participation in or catalysis of cathodic reactions involving the electrochemical reduction of molecular oxygen or water.

The term "metallic" as used herein refers to a material which includes in substantial part one or more metals. It encompasses a material which is made up of a single metal, or more than one metal (in alloy form or otherwise), or a material which contains both one or more metals and one or more other nonmetallic components in the form of one or more compounds, or in the form of a composition.

When the core material is metallic it is electrically conductive. The term "electrically conductive" as used herein refers to a material which obeys Ohm's law and therefore is capable of conducting electricity. In certain embodiments, an electrically conductive core material in accordance with the invention advantageously has a resistivity of less than about $15 \times 10^{-6}$ ohm-cm at 0° C., more advantageously below about $10 \times 10^{-6}$ ohm-cm.

Advantageously, the analysis of a metal or metal alloy which is selected for the core material is substantially the same as the analysis of the metallic material which is sought to be protected against galvanic corrosion. For purposes of this invention, the respective metallic analyses are considered substantially the same when the core material contains the same metal(s) as the metallic material, or equivalent metal(s), in an amount or amounts sufficiently similar such that there is no appreciable electrochemical potential difference between the core material and the metallic material. In certain other embodiments the core material is a conductive metal or metal alloy which is more anodic than the metallic material, that is, the metal of the substrate (e.g., the metal of the housing), sought to be protected. The core material can be selected from various suitable metals or metal alloys, the specific choice in each case depending upon the metal of the substrate to be protected.

Advantageously, the metal of the core material can be aluminum, tin, zinc, nickel, cadmium or magnesium. Other metals can be used, as well as metal alloys (such as tin/antimony alloy), so long as these metals or metal alloys are electrically conductive. Optimum galvanic compatibility can be achieved by using a core material of the same metal or metal alloy as that of the substrate which is sought to be protected.

Metallic core materials are advantageously in particulate form. In some embodiments the particles are substantially spheroidal, for instance spherical, but in other embodiments are irregular. The core material particles can also be a combination of any two or more configurations as aforesaid.

In other embodiments, the core material comprises one or more substances which is substantially electrochemically inert in respect of the metallic material which is sought to be protected. That is, the core material is one or more substances incapable of entering into an appreciable electrochemical interaction with the metallic material sought to be protected. Since there is no appreciable electrochemical interaction, the core material does not practically speaking, contribute to galvanic corrosion. Suitable core materials of this type are glasses, such as soda lime glass or borosilicate glass, as well as ceramic substances such as Alundum®, and mica and other minerals. This type of core material is also advantageously in particulate form. The particles can be substantially spheroidal (such as spherical), either solid or hollow (for example, hollow microspheres), but can alternatively be irregular, or in the form of fibers, strands or the like. Additionally, these particles can be a combination of any two or more of the foregoing configurations.

In still other embodiments of the invention, the core material is a composite; there is a component having an analysis substantially the same as that of the metallic material sought to be protected, and another component which is substantially electrochemically inert in respect of the metallic material sought to protected against galvanic corrosion. As in the preceding two cases, each of these components is typically selected so as to eliminate or minimize galvanic corrosion. Typical combinations are a metallic portion and an inert portion which are compatible with one another, joined in a composite particulate material configured as described heretofore. For instance, the core material can be a galvanically compatible metal or metal alloy coated on an inert particulate substrate, such as tin coated on glass fiber segments or aluminum coated on hollow glass microspheres.

The other component of the composite particles of the invention is an electrically conductive material which is also galvanically compatible with the metallic material sought to be protected against galvanic corrosion. The electrically conductive material must have a number of properties, in combination, in accordance with the invention. More specifically:

(1) The material has sufficiently high electrical conductivity such that it is useful for the contemplated application, such as EMI shielding or electrostatic charge-dissipation.

(2) The electroconductive material should be substantially inert to participation in, and to catalysis of, cathodic reaction involving the electrochemical reduction of molecular oxygen or water. Accordingly, the material's presence should not lead to any appreciable reduction as aforesaid, thereby eliminating a possible source of galvanic corrosion. This property of the electrically conductive material is essential to achievement of galvanic compatibility between the composite particle of the invention and a given metallic material.

(3) The electrically conductive material is bonded to the core material. This means that, when joined in a composite particle in accordance with the invention, the two materials do not de-bond or separate during fabrication and utilization of a composition containing the composite particle. In certain advantageous embodiments, the bonded particles can be "conductively bonded", i.e., the core material is metallic or contains a metallic component and the electrically conductive material is in electrical contact with the core material so that electrons can pass back and forth between the two. And, in certain more specific embodiments, the electrically conductive material is conductively fused with the core material. The term "conductively fused" as used herein refers to a condition in which the electrically conductive material, for instance a refractory material, is integral with the core material and/or with a surface oxide layer, such that the material is in contact with or sufficiently proximate the core material that electrons can pass back and forth between the two. The state of being conductively fused includes embodiments in which the electrically conductive material (e.g., refractory material) is separated from the core material by some amount of surface oxide layer, as long as the interposed oxide does not prevent substantial passage of electrons.

Regarding item (3) immediately preceding, in certain advantageous embodiments the electrically conductive material is present in such form and amount that any electrically insulating oxides (i.e., oxides which would have the tendency to interfere with or resist the flow of electrons) present do not substantially impair (i.e., render unsuitable for the contemplated application) the conductivity between the core material and the electrically conductive material, or between adjacent composite particles when they are incorporated in a composition in accordance with the invention. These embodiments as aforesaid include ones in which—along with the electrically conductive material—there are some insulating oxides on the core material, for instance occupying discontinuities in the electrically conductive material's coverage of the core material's surface, but the overall conductivity between adjacent composite particles in use is not substantially impaired. (Indeed, in some embodiments, the core material has a surface oxide layer. As will be appreciated, certain of the aforementioned metals and alloys typically form oxides when in contact with ambient atmosphere, and thus naturally carry an oxide coating. For example, in the case where the core material is aluminum, the oxide layer is $Al_2O_3$ (e.g., hydrated aluminum oxides, or aluminum oxides which are not hydrafted, or some combination thereof.)

The electrically conductive material can be in the form of a coating on the particulate core material. The coating can be substantially continuous over the surface of a particulate core material (this includes without limitation the embodiments in which the electrically conductive material is continuous over the entire surface of the particulate core material), but in certain other embodiments the coating is discontinuous, with the proviso that the coating covers sufficient portions of the core material particles and is of sufficient thickness that conductivity between adjacent composite particles in the composition is not substantially impaired by the aforementioned electrically insulating oxides. Alternatively, the electrically conductive material can be a particulate material with which the surface of the core material is studded. In this case, the particles of electrically conductive material protrude from the core material to provide contact points at which adjacent composite particles can touch, or at least approach one another with sufficient proximity, that electrons can flow between adjacent composite particles to provide electrical conductivity without substantial impairment resulting from the formation of any electrically insulating oxides on the core material.

The electrically conductive material is typically metallic, but it can be another suitably conductive substance such as glassy or vitreous carbon. For example, it can typically be a metal or metal alloy. In some of these embodiments the material can be selected from the group consisting of tin, aluminum, zinc, nickel, and cadmium. For other embodiments, when using certain metallic substrates, gold and indium can be used with selected core materials as long as the requirements of the invention as aforesaid are satisfied. In still other embodiments the electrically conductive material is a metal-containing compound, such as a metal carbide, metal sulfide, metal silicide, metal boride, metal nitride or metal oxide, or a combination of two or more of such compounds. Typical suitable metal carbides are tungsten carbide, niobium carbide, titanium carbide, vanadium carbide, molybdenum carbide, zirconium carbide and boron carbide. Typical suitable metal sulfides are copper sulfide, silver sulfide, iron sulfide, nickel sulfide, cobalt sulfide, lead sulfide and zinc sulfide. Typical suitable metal silicides are chromium silicide, molybdenum silicide, cobalt silicide, vanadium silicide, tungsten silicide and titanium silicide. Typical metal borides are chromium boride, molybdnum boride, titanium boride, zirconium boride, niobium boride and tantalum boride. Typical metal nitrides are tantalum nitride, titanium nitride, vanadium nitride and zinconium nitride. Typical suitable metal oxides are tin oxide, iron oxide, manganese oxide, copper oxide, lead oxide, ruthenium oxide, chromium oxide, silver oxide and antimony oxide.

In certain advantageous embodiments the electrically conductive material is a refractory material. The term "refractory material" as used herein refers to a chemical compound which is capable of conducting electricity and which is slow to melt and which resists the action of heat; these compounds have high melting temperatures and are stable over a wide range of temperature. Refractory materials in accordance with the invention can typically be selected from a variety of refractory materials well known in the art (2). The refractory material in accordance with the invention can be a single refractory material or a combination of two or more refractory materials. In certain advantageous embodiments, the refractory material has a hardness which is greater than the hardness of the core material. In certain other preferred embodiments such as where the oxide layer of the core material is particularly thick, the refractory material can be harder than the oxide layer. Typically, the hardness of the core material is on the order of about 1 to 6 Mohs and the hardness of the refractory material is on the order of about 3 to 10 Mohs. Advantageously, the refractory material has a resistivity less than 1 ohm-cm. Preferred refractory materials include metal carbides, metal silicides, metal nitrides and metal oxides listed above, especially, WC, $W_2C$, NbB, $NbB_2$, TiN, $VSi_2$, MoB, $TiB_2$, $ZrB_2$, $B_4C$, ZrN, $CoSi_2$ and $MoSi_2$.

In certain advantageous embodiments, the core material and the refractory material are conductively fused by configuring the particle such that the refractory material provides a conductive path through the oxide layer of the core material to the core material itself. Typically, the refractory material breaches the oxide layer so as to make contact with the core material and extend outwardly from the oxide layer. Thus, an electrical current can be conducted through the oxide layer to the core material via the refractory material.

Alternatively, the electrically conductive material can be a conductive polymer. Polymers of this type are typically polyacetylene, poly (p-phenylene), poly (p-phenylene chalcogenides), polypyrrole, polythiophenes, polyaniline, and polyquinolines, though others (such as polymers with aromatic or heteroaromatic units and conjugated aliphatic units) can also be suitable in various embodiments as long as the requirements previously set forth for the electrically conductive material are satisfied. The polymers can be doped appropriately with materials which confer or enhance conductivity, such as lithium (e.g., $Li^+PF_6^-$), arsenic (e.g., $As_5F_5$), molybdenum (e.g. $MoCl_5$, $MoCl_4$), antimony (e.g., $SbF_5$), fluorosulfuric acid and the like. Such polymers and dopants are known to those of ordinary skill in the art from the literature (see, for instance, Handbook of Conducting Polymers, Vols. 1 and 2, Skotheim (Ed.), Published by Marcel Dekker, Inc., New York (1986)).

In the composite particles according to the invention, the core material is present in an amount of about 10 to 99.5 weight percent, preferably about 30 to 95 weight percent, more preferably about 60 to 90 weight percent, and the electrically conductive material, for instance, refractory material, is present in an amount of about 90 to 0.5 weight percent, preferably about 70 to 5 weight percent, more preferably about 40 to 10 weight percent. Advantageously, the core material is a particle of size about 0.5 to 200 microns in average dimension, preferably about 10 to 90 microns, more preferably about 20 to 45 microns. In those embodiments where the core material has a continuous or discontinuous oxide layer, this layer has an average thickness of about 2 to 10,000 angstroms, preferably about 3 to 500 angstroms, more preferably about 5 to 100 angstroms and still more preferably about 5 to 15 angstroms. The electrically conductive material, when in the form of a coating (whether substantially continuous or discontinuous), is typically of thickness from 50 to 200,000 angstroms. When the electrically conductive material, for instance a refractory material, is a particle it is typically of size about 0.005 to 20 microns in average dimension, preferably about 0.05 to 5 microns, more preferably about 0.1 to 1 micron. Generally, the particles of the electrically conductive material, especially the refractory material, are of size ranging from about twice the thickness of any oxide layer of the core particle to about one tenth the size of the core particle.

Preferred composite particles include the following (the electrically conductive material, for instance refractory material, is listed first with the core material following the slash): In/Al; Au/Al; phosphate or chromated chemical conversion coating/Al; $CoSi_2$/Al; mixed conductive oxides of Sn and Sb/Sn—Sb alloy; WC/Al; TiN/Al; $VSi_2$/Al; NbB/Al; WC/Sn; and NbB/Sn.

In accordance with the preceding description, FIG. 1 A shows two illustrations, 41 and 43, of composite particles embodying the invention. In composite particle 41, a particle of core material 42 is coated with electrically conductive material 44. The coating material 44 covers substantially all of the surface of the core material particle 42. In another embodiment of the invention, composite particle 43 contains core material particle 46 which is discontinuously coated with electrically conductive material 48. The core material particle's surface is covered in part by electrically insulating oxide formations 50. Some of these oxide formations occupy portions 52 of such surface left uncovered by the electrically conductive material, and some of the formations are interposed at locations 54 between the core material and the electrically conductive material. The electrically conductive material at location 54 does not make direct contact with the core material 46, but rather is sufficiently proximate the latter to permit flow of electrons between the two, and additionally is indirectly in contact with the core material through other portions of the electrically conductive coating which make direct contact with the core material. In the case of particle 43 the form and amount of the electrically conductive material is sufficient such that the oxide formations do not substantially impair conductivity.

Figure 1B:
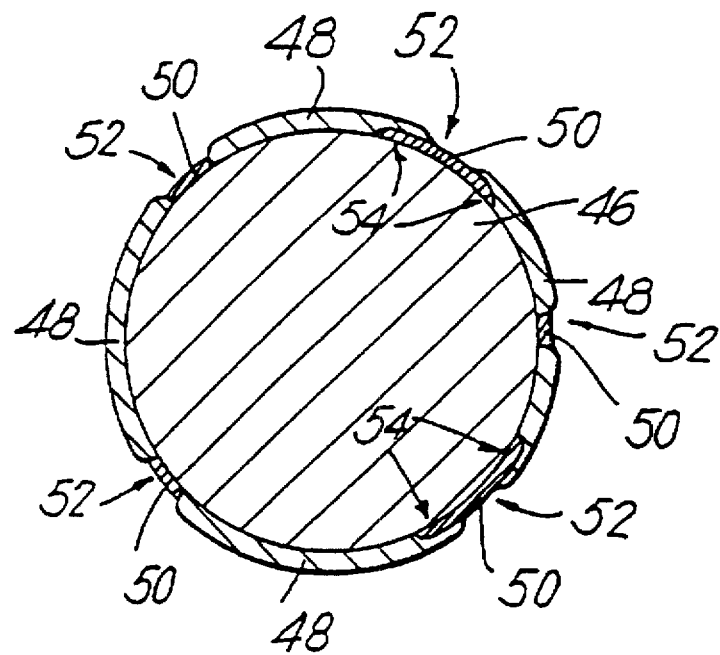

FIG. 1B shows two embodiments, 11 and 13, of the composite particles according to the invention. In composite particle 11, the refractory material particles 10 extend outwardly from oxide layer 12, and also breach it to make contact with core material 14. Thus, in another embodiment of the invention, a composite particle comprises in combination an electrically conductive core material, having a surface oxide layer, and an electrically conductive material, such as a refractory material, wherein the electrically conductive material (e.g., refractory material) comprises a plurality of particles, each of which particles breaches the oxide layer so as to make contact with the core material and extends outwardly or protrudes from the oxide layer. Compare composite particle 13, in which refractory material particles 16 and 18 extend from and breach oxide layer 12 of core material 14 but do not make direct contact with core material 14 as do refractory material particles 10 in composite particle 11. Rather, refractory material particles 16 and 18 make indirect contact with core material 14 through contact with refractory material particle 20 which makes direct contact with core material 14.

Figure 1C:
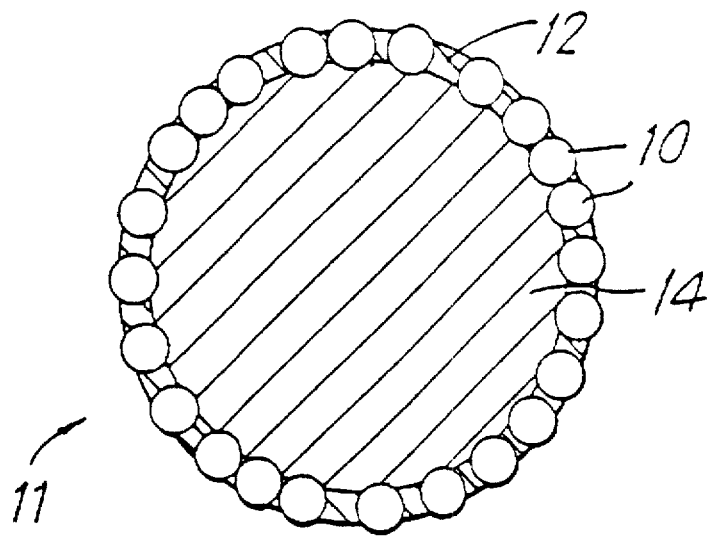
Figure 1D:
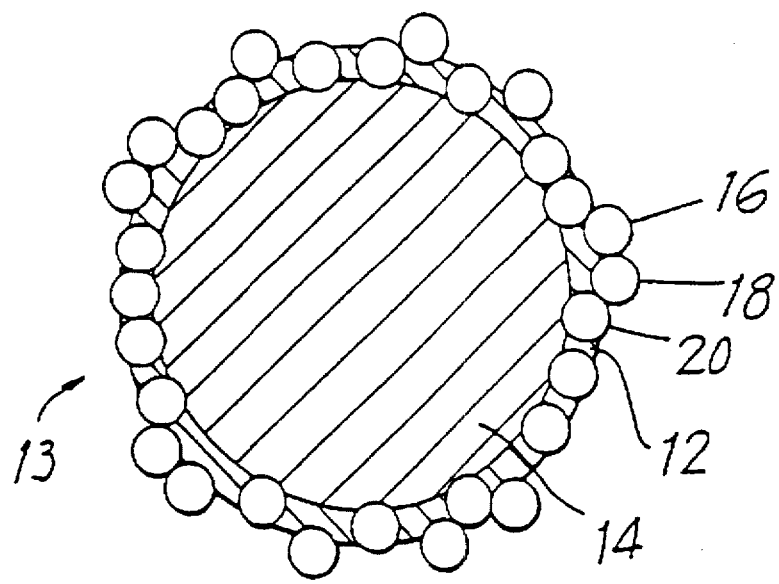
Figure 1E:
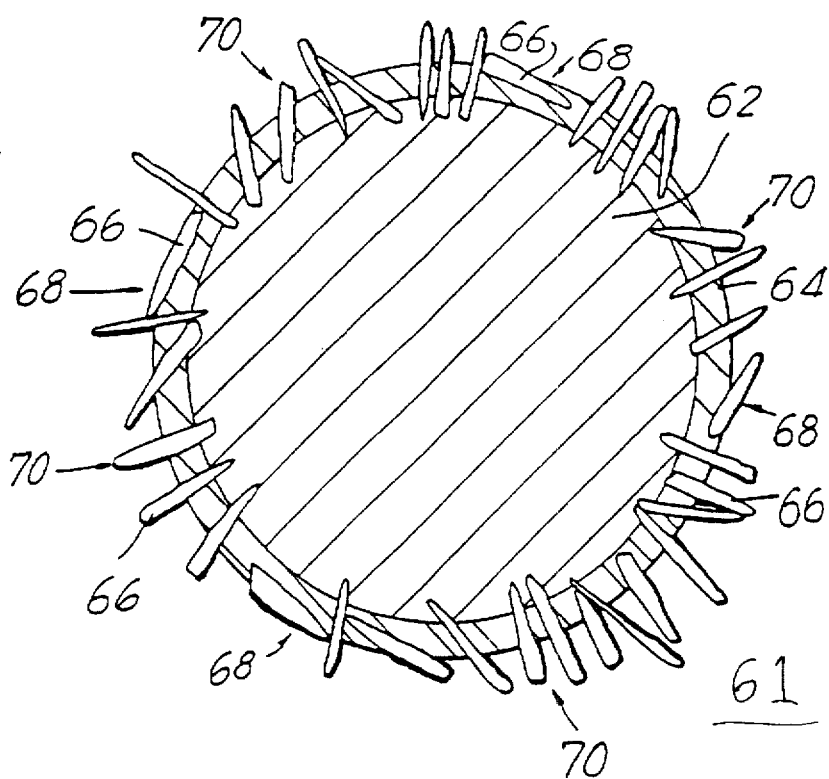

FIG. 1C shows a composite particle 61, which although still depicted schematically, is a more precise representation of a composite particle embodiment in accordance with the invention where the electrically conductive material is a refractory carbide. Core material 62 carries an oxide layer 64. The refractory metal particles 66, in this case tungsten carbide, are acicular in configuration (which more closely approximates their real shape than in FIG. 1A). Some of the carbide particles 68 are embedded into the oxide-coated core material particle on their sides, while some others 70 are embedded at an end. The overall effect is to achieve a protrusion of the carbide particles beyond the core material to secure the desired configuration facilitating good electrical conductivity of the composite particle. The schematic representation of this figure of drawing is based on the photographic representations contained in the SEM photographs included as FIGS. 4, 6 and 7.

The composite particle of the invention is suitably prepared by a number of different methods.

One method comprises atomizing a molten mixture of the core material and the electrically conductive material to obtain particles of the molten mixture. The particles are thermally treated, typically after sufficient cooling to effect partial or substantial solidification, to bring about diffusion of the electrically conductive material to the surface of the particles such that a coating of the electrically conductive material (either substantially continuous or discontinuous) is formed on the residuum of the initial mixture, which corresponds to the core material. As will be appreciated, this method is generally best adapted for use with metallic core materials and metallic electrically conductive materials, preferably metal and metal alloy materials. Depending on the nature of the electrically conductive component, the coating so formed can be in the form of a metal or metal alloy, or—for instance in the case where tin or a tin-antimony alloy is utilized (e.g. with aluminum core material) —can form a conductive oxide coating which has a very low activity for supporting the cathodic reduction of molecular oxygen and water.

Once in possession of the teachings provided herein, one of ordinary skill can apply conventional powder metallurgy techniques to effect the formulation of the molten mixture, its atomization, cooling of the resulting particles, and their collection and handling. The thermal treatment of the particles to effect diffusion is carried out at a temperature of 200° or greater, preferably from 300° to 500° C, provided that the temperature is less than the melting point, for a time sufficient to result in the desired diffusion, typically 2 to 24 hours. The effects of time-at-temperature are, generally speaking, correlative; a lower temperature often requires longer treatment time, and vice versa. One of ordinary skill in the art will be able, once provided with the subject matter hereof, to select an appropriate time and temperature for the thermal treatment without undue experimentation. Furthermore, in certain preferred embodiments, the thermal treatment of the particles is carried out under a controlled atmosphere which promotes conversion of the diffused material to conductive oxides as described above. This atmosphere can be, for example, ordinary air, or other gas containing molecular oxygen. In other embodiments, the diffused metal or metal alloy can be exposed to an atmosphere containing a component which interacts with the metal or metal alloy to produce a sulfide, a carbide, a silicide, a nitride or a boride. For example, to produce a sulfide one would treat the diffused metal or metal alloy in an atmosphere comprising hydrogen sulfide; to form a carbide, in an atmosphere comprising carbon monoxide. Furthermore, in certain embodiments the treatment can be carried out at a selected pressure higher than ambient pressure to induce formation of the desired oxide, etc. In the alternative, the atmosphere is inert (e.g., nitrogen) or reducing (e.g., hydrogen), such that the atomized particles do not oxidize appreciably during treatment.

Another method by which the electrically conductive material can be incorporated in the composite particle of the invention is vapor deposition. In this method a thin coating of the electrically conductive material is formed on the core material. While in some embodiments the coating can be deposited by condensation of metal vapor originating from molten metal, high voltage discharge between electrodes, evaporation, ion discharge or sputtering (such as sputtering of titanium in a nitrogen atmosphere to form titanium nitride), chemical vapor deposition is the preferred mode of operation. Examples of such preferred modes are deposition via hydrogen reduction or thermal decomposition (gas plating) of volatile metal halides, and thermal decomposition of mixtures of volatile organic compounds of metals with compounds of silicon, carbon, boron or nitrogen which deposit in combination metal silicides, carbides, borides or nitrides. Once in possession of the teachings herein, one of ordinary skill can apply such vapor deposition techniques along conventional lines to practice the invention. In connection with the vapor deposition embodiments, as well as other embodiments in which the suppression of oxide formation on the core material particles is also a high priority, an especially suitable technique for producing the core particles is atomization of molten core material (particularly metallic core material), preferably under protective conditions such that the particles are substantially oxide-free. After production of such particles they are typically stored under conditions which protect against any appreciable oxidation until use. Measures which afford protection against oxide-formation are, in and of themselves, well known in the art, involving for instance the utilization of an inert (e.g., nitrogen) or reducing (e.g., hydrogen) atmosphere during atomization and/or storage. Examples of composite particles produced by vapor deposition are aluminum particles coated with tungsten carbide and aluminum particles coated with cobalt silicide, the aluminum core particles being substantially oxide-free as a result of having been produced by atomization, and stored in an inert atmosphere.

The conductive polymers described heretofore can also be applied to the core material as a coating to form a composite particle in accordance with the invention, provided that the core material selected is compatible with (e.g., not oxidized by) the polymers. An example of such an inert core material is a glass. This is suitably achieved by application of well known solvent coating or film forming techniques, the utilization of which will be understood by those of ordinary skill in the art once in possession of the subject matter hereof.

Yet another method by which the electrically conductive material is suitably incorporated in the composite particle of the invention is wet chemical conversion. Such coatings are formed, for example, by chromating or phosphatizing on the core material in particulate form. This method typically does not require use of an oxide-free core because the reagents used chemically etch the oxide during the reaction. In some embodiments, the electrical conductivity of coatings formed by wet chemical conversion can be enhanced by doping such coatings with, for instance, gold or a semiconductive metal oxide as heretofore discussed through the inclusion in the reaction mixture of one or more suitable chemical agents.

Still another method which can be utilized for incorporating the electrically conductive material in the composite particle of the invention is depostion of a sol gel containing the electrically conductive material (e.g., by spraying or immersion) on core material particles, and then causing the gel to coalesce under suitable (conventional) conditions. This method would typically be used to deposit semiconductive materials such as oxides (e.g., tin oxide, optionally doped with antimony) on the core material.

A further method for incorporating the electrically conductive material in the composite particle of the invention is electrolytic or electroless plating. Electrolytic plating involves deposition from solution of the electrically conductive material on the core material, acting as cathode, as a result of passage of an externally provided electric current through the solution. Electroless plating is a chemical reduction process somewhat similar to electrolytic plating except that externally provided current is not needed. The electrically conductive material deposits, from solution, on the core material substrate as a result of reduction of ions of the electrically conductive material by one or more chemical reducing agents in the solution or by direct immersion-displacement plating or metallic cores with metals more noble than the core. Electrolytic plating is utilized generally with metal or metal alloy core materials, while electroless plating can be utilized with any of the core materials suitable for practice of the invention, including ones which are not metals or metal alloys. As will be appreciated, in both electrolytic and electroless plating the electrically conductive material is a metal, or a metal alloy or a metal or metal alloy treated chemically to convert it at least partially into a semiconductive compound (e.g., an oxide, sulfide, nitride, or silicide).

The composite particles according to the invention can also be prepared by "Mechanofusion", hybridization and/or mechanical alloying. The term "Mechanofusion" (this term is a trademark of Hosokawa Micron International) as used herein refers to a process whereby materials with new properties are created by imparting extreme forms of mechanical energy to two or more kinds of materials under a controlled condition, thereby causing a mechanochemical reaction on the surfaces of such materials being processed. The mechanofusion process is well known in the art (3, 4, 5). The term "hybridization" as used herein, refers to a method of modifying particle structure and surfaces by embedding or dry filming a fine particle onto the surface of a core particle. The hybridization process is also well known in the art (6, 7). Like mechanofusion and hybridization, mechanical alloying, especially ball milling, is well known in the art (8, 9).

Accordingly, the composite particles of the present invention can be readily made by those skilled in the art.

It will be appreciated that, in certain advantageous embodiments, the composite particle of the invention comprises in combination an electrically conductive core material, having a surface oxide layer, and an electrically conductive refractory material, the core material and the refractory material being conductively fused. The core material can be any suitable material (or combination of substances) which is capable of conducting electricity, preferably a metal or metal alloy. This composite particle is produced by a method which comprises contacting an electrically conductive core material in particulate form, said core material particles having a surface oxide layer, with an electrically conductive refractory material in particulate form under conditions such that the core material and the refractory material are conductively fused. Additionally, in another advantageous embodiment, this composite particle comprises in combination an electrically conductive core material having a surface oxide layer and an electrically conductive refractory material, the particle being configured such that the refractory material provides a conductive path through the oxide layer to the core material.

In certain embodiments, the method of making the composite particles preferably comprises the step of contacting the various materials as aforesaid so that the particle is configured such that a refractory material provides a conductive path to the core material through an oxide layer. Typically, the oxide layer is breached by the refractory material. Advantageously, the refractory material is embedded in the electrically conductive core material.

As noted above, the invention also resides in, respectively, an EMI shielding material and an electrostatic charge dissipation material. Each comprises in combination a binder matrix and a plurality of composite particles, as described herein, dispersed throughout the matrix. The amount of composite particles included is, in each case, an amount which will be sufficient to achieve the desired shielding or dissipation effect, and can be derived empirically by one of ordinary skill in the art without undue experimentation once provided with the teachings herein. The material can take the form of a gasket, caulk, adhesive, coating, etc.

Figure 2:
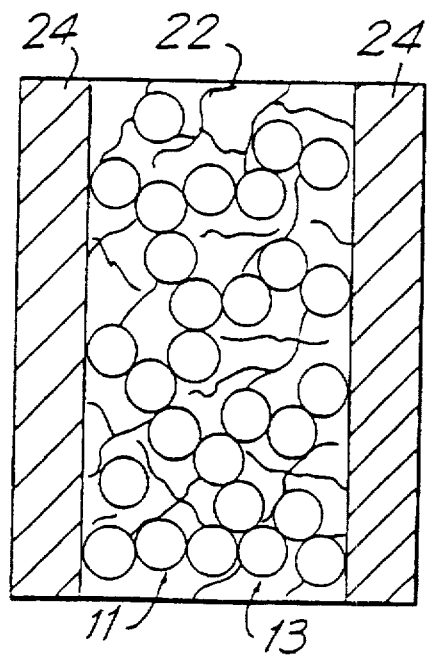
FIG. 2 is a schematic representation of a gasket material according to the invention.

FIG. 2 is a schematic representation of a gasket material 22 sandwiched between metal plates 24. Gasket material 22, an EMI shielding material, is filled with a plurality of composite particles 11 and 13, or alternatively with particles 41, 43 or 61 or some combination of two or more of particles 11, 13, 41, 43 and 61 as previously described in FIG. 1 and depicted herein as circles for the sake of simplicity. Conductive particles 11 and 13 (or 41, 43, 61 or the combination as mentioned above) are networked in such a way as to provide a conductive pathway for electrical current. Alternatively, another embodiment would be an EMI shielding or electrostatic charge dissipation coating, shown at 22, on right-hand plate 24 which is a surface of, for example, an equipment housing (the left-hand plate is disregarded in this case).

In another aspect, the invention is an EMI shielding material or electrostatic charge dissipation material comprising in combination a binder matrix and a plurality of composite particles dispersed throughout the matrix, the particles comprising in combination an electrically conductive core material, having a surface oxide layer, and an electrically conductive refractory material, the core material and the refractory material being conductively fused. In a particularly preferred embodiment each particle is configured such that the refractory material breaches the oxide layer so as to make contact with the core material and extend outwardly from the oxide layer.

Yet another aspect of the invention is directed to a method of providing EMI shielding or an electrostatic charge dissipation at a selected surface which comprises locating an EMI shielding material or electrostatic charge dissipation material adjacent said surface, said material comprising in combination a binder matrix and a plurality of composite particles as heretofore described dispersed throughout the matrix. In an advantageous embodiment, the particles comprise in combination an electrically conductive core material having a surface oxide layer and an electrically conductive refractory material, the core material and the refractory material being conductively fused.

In still another aspect, the invention is directed to a method for preparing an EMI shielding material or electrostatic charge dissipation material which comprises admixing a binder matrix with a plurality of composite particles so as to disperse the particles throughout the matrix. Each of the composite particles is as described heretofore. In one more specific embodiment the particles comprise in combination an electrically conductive core material having a surface oxide layer and an electrically conductive refractory material, the core material and the refractory material being conductively fused.

In yet another embodiment, the invention is a corrosion protection material. This material comprises (a) a matrix and (b) a plurality of composite particles in accordance with the invention dispersed throughout said matrix. In several good embodiments each of said particles comprises in combination an electrically conductive core material having a surface oxide layer and an electrically conductive refractory material, said core material and said refractory material being conductively fused. The material is produced by admixing composite particles of the invention with a binder material, said particles being incorporated in an amount sufficient to provide electrical conductivity; this can be derived empirically, without undue experimentation, by the skilled artisan once equipped with the teachings herein. The resulting composition is applied to a metal surface and serves to protect the metal surface from corrosion. The composition (a gasket, caulk (e.g., a sealing caluk), coating or adhesive) would serve as a sacrificial anode for the metal surface. The composition, e.g., a gasket, is deteriorated to a certain extent at which point it can be replaced with a new gasket and the protection can be continued. This material functions not only as an EMI shield and an environmental shield but also as a sacrificial anode. Thus, this material would protect the contacted base metal surface from further corrosion.

Various binder materials, both organic and inorganic, can be used for the compositions and other materials described herein, the choice of a particular binder being dependent upon the characteristics which are desired for the composition, e.g., shielding, dissipation or corrosion protection material, in each particular case. For example, the binder can include various synthetic resins, such as epoxies, chlorinated rubber, polystyrene, polyvinyl butyryl resins, polyvinyl acetate resins, silicones, and the like. Inorganic binders can also be used, including binders obtained from silicates, such as alkali metal silicates and sodium silicates, phosphates, hydrolyzed ethyl silicates, butyl-titanates, etc. The use of these and other similar binding materials will be apparent to those skilled in the art so that the particular binder suitable in each case can be selected for use in the composition, e.g., shielding, dissipation or corrosion protection material, according to the invention. Advantageously, the binder is present in the shielding material in an amount of about 20 to 80% by weight, the balance being the composite particles described above. Depending upon the particular binder used, the shielding material can also contain suitable solvents, curing agents, catalysts, plasticizers and the like, all known in the art. The specific amounts of these components, as well as the types used, will depend in each case upon the particular binder as well as the characteristics desired for the particular composition, such as shielding, dissipation or corrosion protection material, and its use.

The composition according to the invention, such as a shielding, dissipation or corrosion protection material, can be applied to the metal substrate to be protected using any suitable technique, for example, spraying, brushing, immersion, flowing, etc. When the composition or material is used as a gasket or caulk, it is typically interfaced between the two surfaces to be sealed. The compositions or materials of the present invention can be formulated by admixing the binder and composite particle components, in the proportions as have been set forth hereinabove, using any suitable mixing techniques. The type and extent of drying or curing will vary in each case, depending on the specific nature of the binder used. For example, in some cases, heating can be utilized to effect drying or cure of the coating while in other cases, simple air drying or curing will be sufficient. In addition to exhibiting good shielding and dissipation characteristics the thus-formed conductive compositions are found to provide excellent corrosion protection for the metal substrates to which they are applied in cases where the compositions act as a sacrificial anode; in other embodiments, even though the compositions do not act as a sacificial anode, they provide excellent EMI shielding or electrostatic charge dissipation while not contributing to galvanic corrosion.

The invention will be more fully described and understood with reference to the following examples which are given by way of illustration.

Figure 3:
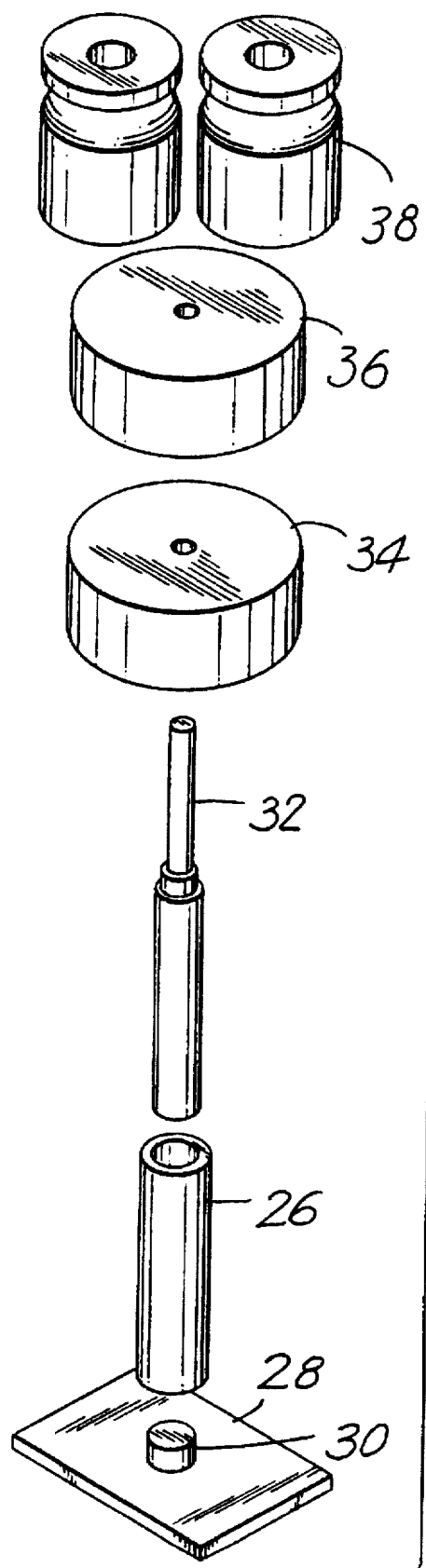
FIG. 3 depicts a device for measuring the powder resistivity of the composite particles according to the invention.

In the following examples, the volume resistivity for the composite particles according to the invention was measured and calculated in accordance with the following description and FIG. 3. Referring to FIG. 3, a precision glass tube 26

(bore tolerance ±½ thousandth of an inch, ½" I.D.×¾" O.D.×3" L, 0.25" wall thickness) is placed on a copper plate 28 (¼"×2"×3") having a nipple 30. One of the open ends of the glass tube 26 insertingly receives nipple 30. The powder sample to be measured is split with a one-to-one splitter on a piece of clean paper until a sample of approximately 5 grams is obtained. The 5 gram sample is then accurately weighed and placed into the glass tube using a small funnel. The copper plate with attached glass tube is then placed on a Syntrol Electric Vibrator Model FC-TO. A copper rod 32 (½" D×5¼" L) is placed on the sample by inserting the copper rod into the glass tube 26. A one kilogram weight 34 is then placed on the copper rod, the range of the electric vibrator is set at 4.5 and the vibrator is then turned on for 60 seconds. The vibrator is then turned off and the height (cm) of the sample between the faces of the copper plate and the copper rod is measured with a ruler. Two clip-type probes (positive) are then attached to the top of the copper rod and two clip-type probes (negative) are attached to the contact on the copper plate. A resistance reading is then taken using a Hewlett Packard Milliohmeter Model 4328A. A second one kilogram weight 36 is then placed on top of the first one kilogram weight 34, the total weight is recorded as two kilograms and a second resistance reading is recorded. Two 1 lb. weights 38 are then placed on top of the two 1 kilogram weights, the total weight is recorded as 2.907 kilograms and a third resistance measurement is recorded. The height of the sample is again measured with a ruler as above.

The volume resistivity (P, ohms-cm) and the average volume resistivity are calculated as follows:

1. Calculate volume resistivity (ohms-cm) of the sample with the formula $$P = \frac{R \frac{d^2}{4} pi}{L}$$

where:
P=resistivity (ohms-cm)
R=resistance (ohms)
d=inside diameter of glass tube (cm)
L=sample height (cm).

2. Average (mean) of the sample can be calculated as $$\bar{x} = \frac{\text{sum of } X}{N}$$

where:
x̄=average (mean) of sample
X=sample value
N=number of tests.

EXAMPLE 1

The following is an example of the preparation of composite particles according to the invention via mechanofusion. Thirteen samples (1A–1C, 2A–2D, 3A, 3B, 4A–4C and 5) were prepared using mechanofusion. Table 1 summarizes the processing parameters for each of the thirteen samples.

In the preparation of sample 3A, which is representative, aluminum spheres, 180 g, 75 microns, and titanium nitride, 50 g, 1–5 microns, were charged into the mixing chamber of a Hosakowa AM-15F mechanofusion machine equipped with a glovebox. The mixing chamber was sealed by installing the cover and bolting firmly. The glove box was secured over the chamber and argon gas was then purged into the chamber until the percentage of oxygen dropped to about 0.7%. Rotation of the mixing chamber was then initiated to a speed of about 500 RPM for two minutes. The speed was then increased to 900 RPM for three minutes and further increased to 1200 RPM for 35 minutes. At the end of the 35 minute period, the temperature increased to 159° C. Rotation was then stopped and the material was allowed to cool in the chamber under an argon atmosphere. When the material cooled to 75° C., it was removed from the chamber and allowed to cool to room temperature in air.

Figure 4:
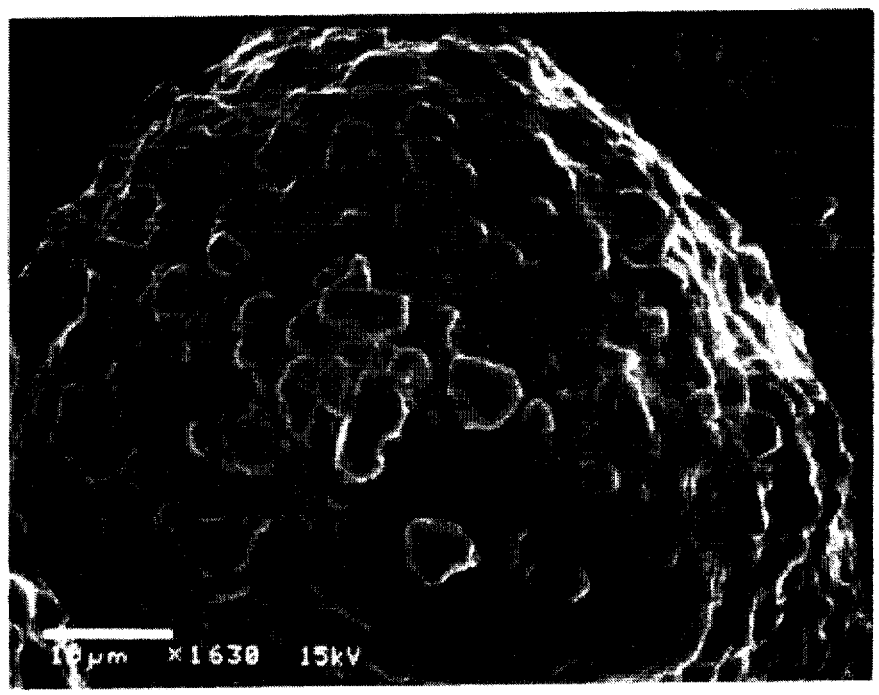
FIGS. 4, 6A, 6B, 7A and 7B show scanning electron micrographs (SEM) of composite particles according to the invention.
Figure 5:
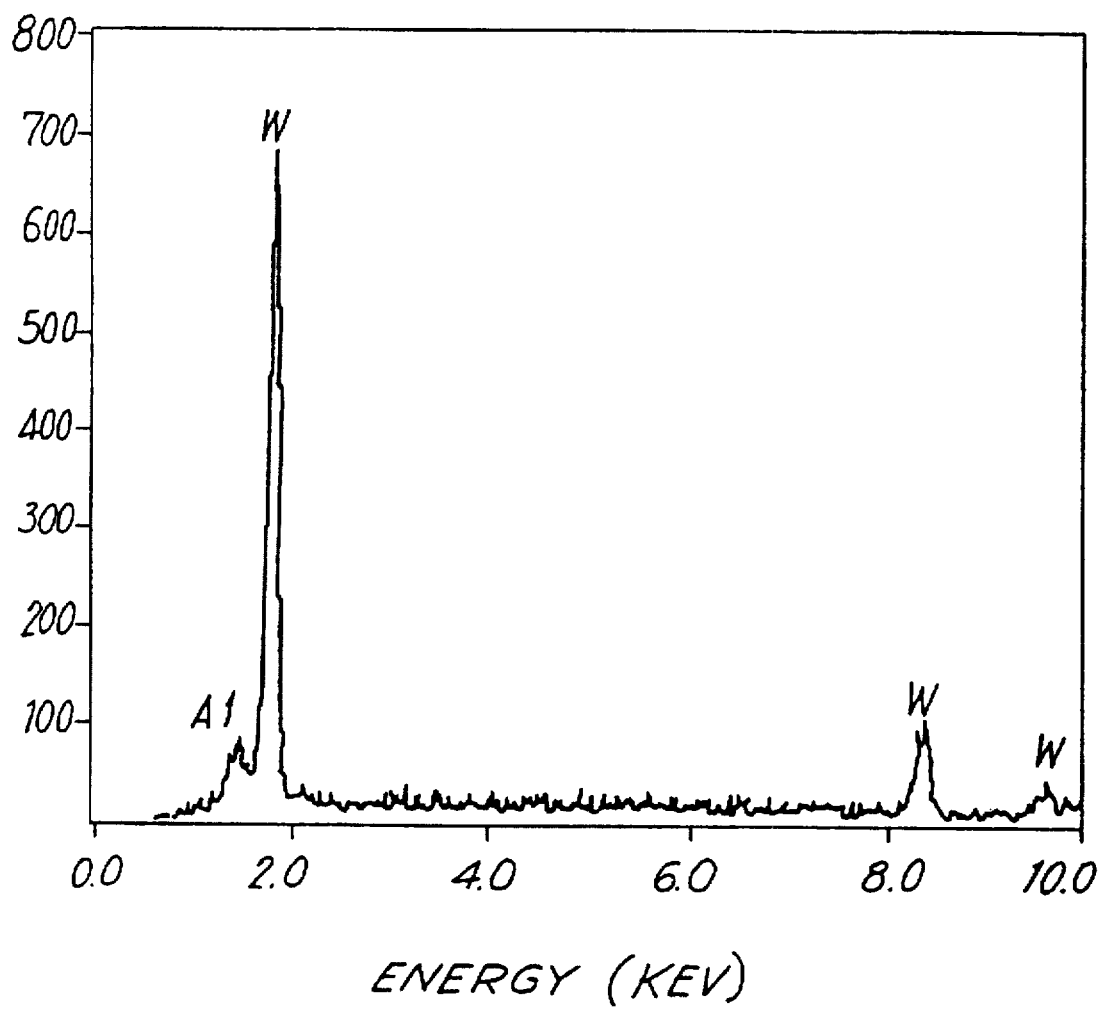

A scanning electron micrograph (SEM) of a single TiN/Al composite particle from the sample 2D is shown in FIG. 4 for purposes of illustration. In FIG. 4, the irregularly shaped, light banded areas correspond to the refractory material particles embedded in the core material and extending outwardly from the oxide layer. FIG. 5 is an X-ray dispersive spectrum of a powder of WC/Al particles prepared by the mechanofusion process described hereinabove. Resistivity measurements were taken for nine of the thirteen samples and are summarized in Table 2.

TABLE 1

| | | Mechanofusion Process Parameters | | | | | |
|---|---|---|---|---|---|---|---|
| SAMPLE NO. | CORE MATERIAL | REFRACTORY MATERIAL | TIME (min.) | TEMP. (°C.) | RPM | POWER (KW) | O₂ % |
| 1A | Al (180 g) | WC (60 g) | 0:00 | 27.8 | 500 | 0.22 | 0.6 |
| | | | 2:00 | 27.8 | 900 | 0.42 | 0.5 |
| | | | 5:00 | 48.8 | 1200 | 0.7 | 0.4 |
| | | | 7:46 | 75.8 | 1200 | 0.62 | 0.4 |
| | | | 14:47 | 104.5 | 1200 | 0.62 | 0.2 |
| | | | 24:00 | 128.0 | 1200 | 0.6 | 0.1 |
| | | | 5:00 | 129.7 | 1200 | 0.6 | 0.1 |
| 1B | Al(180 g) | WC(60 g) | RESTART | 103.2 | 1200 | 0.6 | 0.5 |
| | | | 30:00 | 128.6 | 1200 | 0.58 | 0.4 |
| | | | 35:00 | 136.5 | 1200 | 0.58 | 0.4 |
| 1C | Al(180 g) | WC(60 g) | RESTART | 106.2 | 1200 | 0.58 | 0.4 |
| | | | 43:43 | 132.2 | 1200 | 0.58 | 0.7 |
| 2A | Al(150 g) | WC(100 g) | 2:00 | 44.6 | 900 | 0.4 | 0.3 |
| | | | 5:00 | 65.6 | 1200 | 0.62 | 0.1 |
| | | | 13:30 | 130.9 | 1200 | 0.62 | 0.1 |
| | | | 15:00 | 138.0 | 1200 | 0.62 | 0.1 |
| | | | 20:00 | 151.4 | 1200 | 0.62 | 0.0 |
| | | | 25:00 | 161.6 | 1200 | 0.62 | 0.1 |

TABLE 1-continued

| | | Mechanofusion Process Parameters | | | | | |
|---|---|---|---|---|---|---|---|
| SAMPLE NO. | CORE MATERIAL | REFRACTORY MATERIAL | TIME (min.) | TEMP. (°C.) | RPM | POWER (KW) | $O_2$ % |
| 2B | Al(150 g) | WC(100 g) | RESTART | 129.2 | 1200 | 0.58 | 1.7 |
| | | | 30:00 | 149.4 | 1200 | 0.58 | 0.9 |
| | | | 35:00 | 155.3 | 1200 | 0.58 | 0.7 |
| 2C | Al(150 g) | WC(100 g) | RESTART | 130.3 | 1200 | 0.42 | 0.6 |
| | | | 40:00 | 136.6 | 1200 | 0.42 | 0.3 |
| | | | 45:00 | 137.8 | 1200 | 0.42 | 0.2 |
| 2D | Al(150 g) | WC(100 g) | RESTART | 115.1 | 1600 | 0.48 | 0.4 |
| | | | 50:00 | 120.4 | 1600 | 0.48 | 0.3 |
| | | | 55:00 | 123.7 | 1600 | 0.48 | 0.2 |
| | | | 60:00 | 128.0 | 1600 | 0.48 | 0.2 |
| 3A | Al(180 g) | TiN(50 g) | 0:00 | 55.3 | 500 | 0.22 | 0.7 |
| | | | 2:00 | 56.6 | 900 | 0.4 | 0.4 |
| | | | 5:00 | 68.6 | 1200 | 0.58 | 0.4 |
| | | | 10:31 | 103.1 | 1200 | 0.58 | 0.4 |
| | | | 17:00 | 127.2 | 1200 | 0.60 | 0.3 |
| | | | 20:00 | 138.0 | 1200 | 0.60 | 0.2 |
| | | | 23:00 | 144.6 | 1200 | 0.60 | 0.2 |
| | | | 26:25 | 151.0 | 1200 | 0.60 | 0.2 |
| | | | 30:33 | 156.9 | 1260 | 0.58 | 0.2 |
| | | | 35:00 | 162.0 | 1200 | 0.58 | 0.1 |
| 3B | Al(180 g) | TiN(50 g) | RESTART | 134.3 | 1200 | 0.58 | 0.4 |
| | | | 40:00 | 151.3 | 1200 | 0.58 | 0.4 |
| | | | 43:30 | 156.5 | 1200 | 0.58 | 0.3 |
| | | | 45:00 | 158.7 | 1200 | 0.58 | 0.3 |
| 4A | Sn(180 g) | WC(50 g) | 0:00 | 23.8 | 500 | 0.22 | 0.6 |
| | | | 2:00 | 26.0 | 900 | 0.25 | 0.5 |
| | | | 5:00 | 27.9 | 1200 | 0.32 | 0.4 |
| | | | 10:00 | 32.8 | 1200 | 0.3 | 0.3 |
| | | | 15:00 | 35.4 | 1200 | 0.3 | 0.2 |
| | | | 25:00 | 37.1 | 1200 | 0.3 | 0.1 |
| 4B | Sn(180 g) | WC(50 g) | RESTART | 33.2 | 1200 | 0.3 | 0.7 |
| | | | 30:00 | 36.1 | 1200 | 0.3 | 0.3 |
| | | | 35:00 | 36.1 | 1200 | 0.28 | 0.1 |
| 4C | Sn(180 g) | WC(50 g) | RESTART | 33.8 | 1200 | 0.25 | 0.2 |
| | | | 40:00 | 33.3 | 1200 | 0.25 | 0.1 |
| | | | 45:00 | 32.0 | 1200 | 0.25 | 0.1 |
| 5 | Sn(75 wt. %) | WC(25 wt. %) | — | — | — | — | — |

TABLE 2

| | | Powder Resistivity Measurements | | | | |
|---|---|---|---|---|---|---|
| SAMPLE NO. | APPLIED WT. (g) | SAMPLE WT. (g) | HEIGHT (CM) | MEAS. R ($\Omega$) | CALC.* P($\Omega$ CM) | AVG ($\Omega$ CM) |
| 1A | 1 | 5 | 2.2 | 28.0 | 16.60 | |
| | 3 | | 2.2 | 8.0 | 4.63 | 10.39 |
| 1B | 1 | 5 | 2.2 | 24.0 | 13.85 | |
| | 2 | | 2.2 | 7.2 | 4.10 | 9.01 |
| 1C | 1 | 5 | 2.2 | 25.0 | 14.43 | |
| | 2 | | 2.2 | 9.2 | 5.31 | 9.87 |
| 2A | 1 | 5 | 1.9 | 1.10 | 0.74 | |
| | 2 | | 1.9 | 0.58 | 0.39 | 0.56 |
| 2B | 1 | 5 | 2.0 | 1.75 | 1.11 | |
| | 2 | | 1.9 | 0.48 | 0.32 | 0.72 |
| 2C | 1 | 5 | 1.8 | 1.15 | 0.81 | |
| | 2 | | 1.8 | 0.49 | 0.35 | 0.58 |
| 2D | 1 | 5 | 1.8 | 2.00 | 1.41 | |
| | 2 | | 1.8. | 0.38 | 0.27 | 0.84 |
| 3A | 1 | 5 | 2.5 | 4.3 | 2.18 | |
| | 2 | | 2.4 | 2.45 | 1.30 | 1.74 |
| 3B | 1 | 5 | 2.5 | 24.0 | 2.19 | |
| | 2 | | 2.5 | 4.4 | 2.24 | 7.21 |

*CALC. = $\dfrac{\text{READING} \times 1.27 \text{ cm}^2}{\text{HEIGHT (cm)}}$

EXAMPLE 2

The following is an example of the preparation of composite particles according to the invention via hybridization. The core materials used were aluminum and tin. The aluminum particles were somewhat spherical in shape with an average particle size of 60 microns and a specific gravity of 2.7. The tin particles had a variety of shapes ranging from spherical to cylindrical. The average particle size was between 200 and 325 mesh as raw feed. However, after the hybridization process, many tin particles were rounded into a more spherical shape. The refractory materials used were tungsten carbide and niobium boride. The niobium boride ranged in size from 1 to 5 microns and had a specific gravity of 7. The tungsten carbide particles were sub-micron with a specific gravity of 14. Four runs were conducted using a Bepex Model No. HYB-0 Hybridizer and Model No. OMD-0 O.M. Dizer. Tip speeds (12,000 RPM) and residence times (1 min.) were held to low values in order to minimize abrasion. The process particulars and parameters are summarized in Table 3.

In Run 1, which is representative, aluminum spheres, 25.5 g, 60 microns, and tungsten carbide, 4.5 g, 0.5 microns, were charged into the mixing chamber of the Dizer. The Dizer mixer was started and operated at 1500 RPM for four minutes to mix the two raw materials. The mixture was then placed into the mixing chamber of the Hybridizer. The hybridizer was operated for one minute at 12,000 RPM. The material was then allowed to cool to room temperature in air.

Figure 6A:
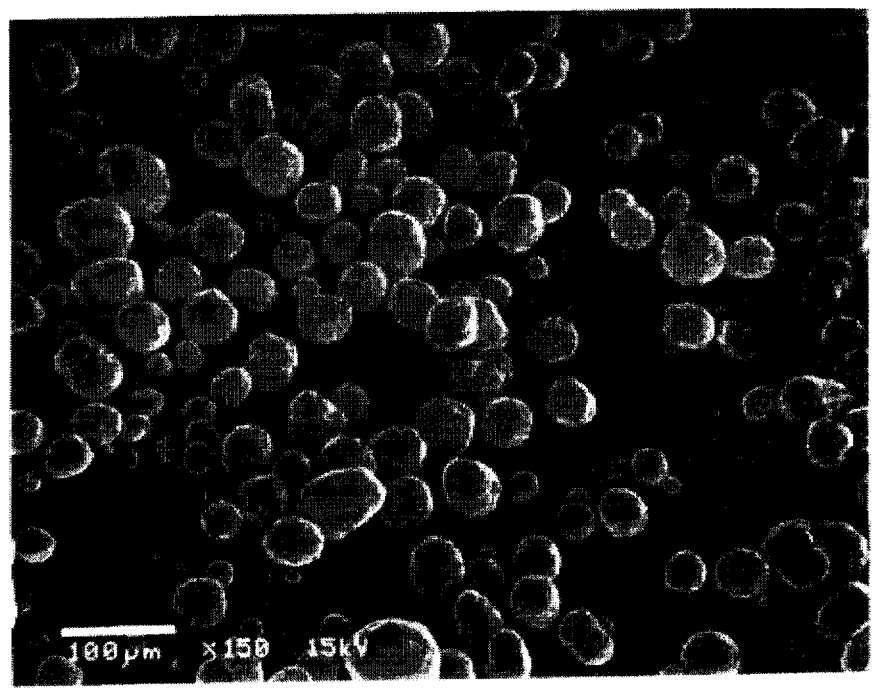
Figure 6B:
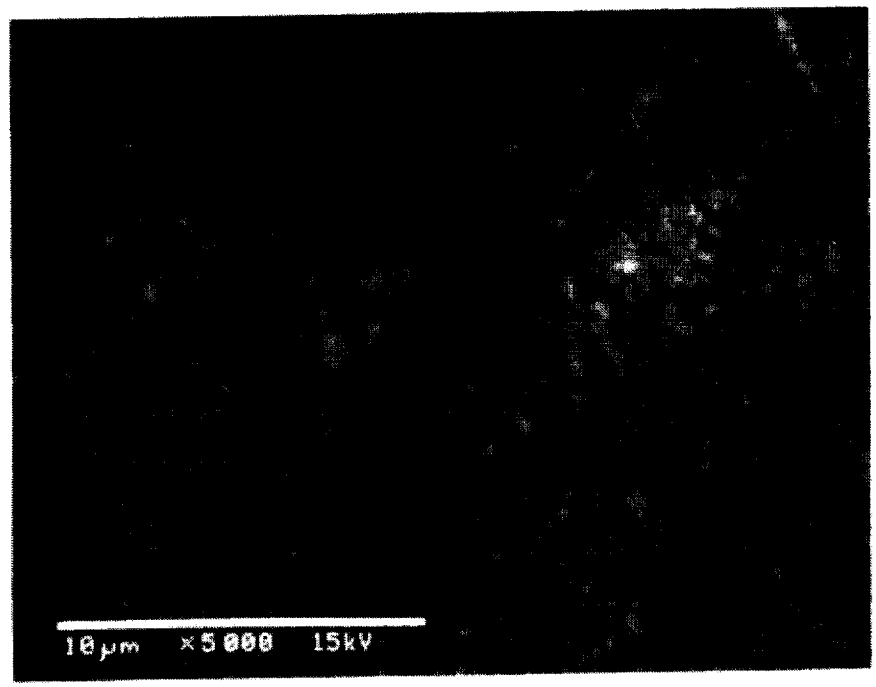

FIG. 6A is an SEM of a field of numerous WC/Al composite particles obtained from the hybridization process described hereinabove and FIG. 6B is a magnified SEM view of the surface of a single WC/Al composite. Referring to FIG. 6B the refractory material particles are finer in size and more tightly packed than the refractory material particles in FIG. 4. Resistivity measurements were taken on material obtained from each of the four runs and are summarized in Table 4.

TABLE 3

Hybridiation Process Parameters

| | RUN 1 | RUN 2 | RUN 3 | RUN 4 |
|---|---|---|---|---|
| CORE MATERIAL | Al | Sn | Al | Sn |
| PARTICLE SIZE ($d_{eq} - \mu m$) | 60 | 60 | 60 | 60 |
| DENSITY Sp. Gr. ($g/cm^3$) | 2.7 | 7.31 | 2.7 | 7.31 |
| MIXING RATIO (BY WEIGHT) | 85% (25.5 g) | 75% | 75% | 75% |
| REPRACTORY MATERIAL | WC | WC | NbB | NbB |
| PARTICLE SIZE ($d_{50} - \mu m$) | 0.50 | 0.50 | 2 | 2 |
| DENSITY Sp. Gr. ($g/cm^3$) | 14 | 14 | 7 | 7 |
| MIXING RATIO (BY. WEIGHT) O. M. DIZER | 15% (4.5 g) | 25% | 25% | 25% |
| MODEL NO. | OMD-O | OMD-O | OMD-O | OMD-O |
| POWER LOAD (Amps) | 1.55 | 1.51 | 1.55 | 1.55 |
| RUN TIME (min.) HYBRIDIZER | 4 | 4 | 4 | 4 |
| MODEL NO. | HYB-O | HYB-O | HYB-O | HYB-O |
| ROTOR SPEED (RPM) | 12,000 | 12,000 | 12,000 | 12,000 |
| RUN TIME (min.) | 1 | 2 | 2 | 2 |
| FEED INITIAL CHARGE (g/batch) | 30 | 30 | 30 | 30 |
| POWER LOAD (Amps) | 4.2 (0 min) | 4.5 (0 min) | 4.3 (0 min) | 4.25 (0 min) |
| | 4.2 (1 min) | 4.5 (1 min) | 4.2 (1 min) | 4.4 (1 min) |
| | | | 4.4 (2 min) | 4.2 (2 min) | 4.4 (2 min) |
| INNER TEMPERATURE (°C.) | 29 (0 min) | 29 (0 min) | 30 (0 min) | 34 (9 min) |
| | 45 (1 min) | 56 (1 min) | 52 (1 min) | 56 (1 min) |
| | | | 64 (2 min) | 59 (2 min) | 67 (2 min) |

TABLE 4

Powder Resistivity Measurements

| Sample* | RESISTIVITY ($\Omega$ cm) |
|---|---|
| WC, 15%/Al, 85% (Run 1) | 1.70 |
| WC, 25%/Sn, 75% (Run 2) | 0.01 |
| NbB, 25%/Al, 75% (Run 3) | 2.00 |
| NbB, 25%/Sn, 75% (Run 4) | 0.76 |

*Percents Given Are Weight Percent

EXAMPLE 3

Figure 7A:
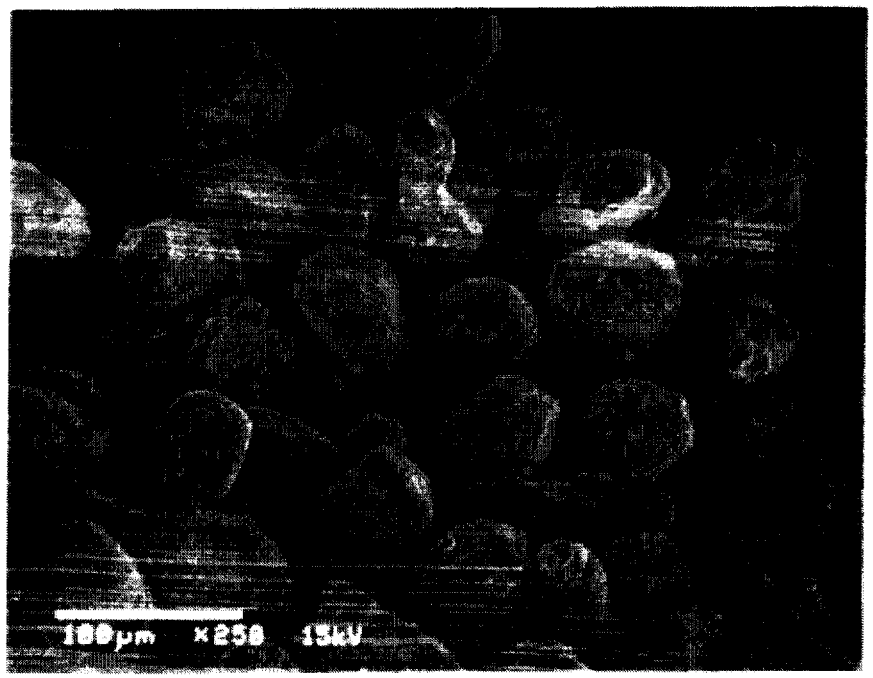
Figure 7B:
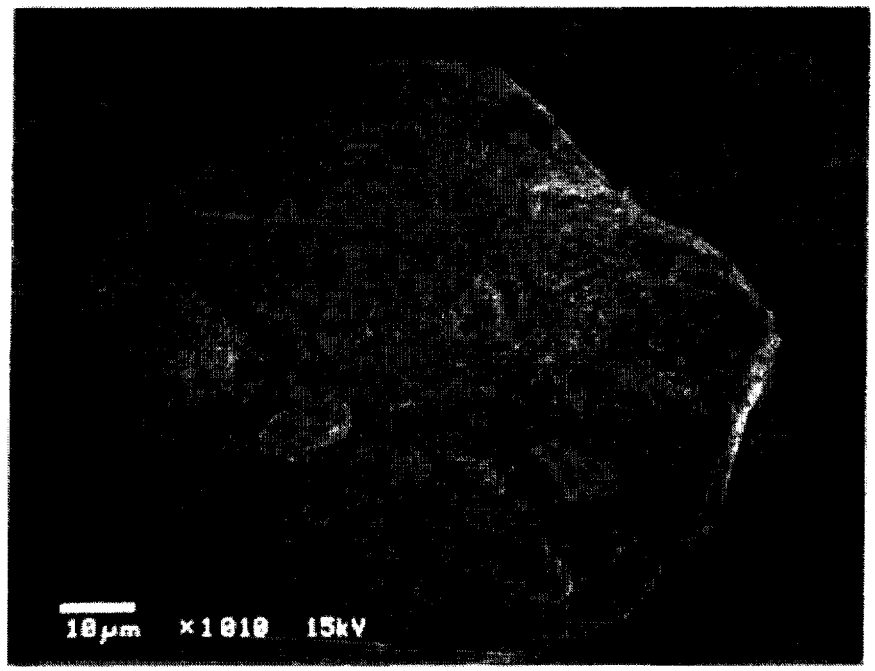

The following is an example of the preparation of composite particles according to the invention by ball milling. Aluminum spheres, in an amount of 75 g, size 75 microns, tungsten carbide particles, in an amount of 25 g, size 0.5 microns, and porcelain balls, in an amount of 500 g, size 0.5" in diameter, were charged into a ball mill jar. The ball mill jar was placed on a roller mill and the roller mill was activated so that the jar rotated at 75 RPM. After two hours, the jar was removed from the roller mill and the contents of the jar were poured over a 20 mesh screen. The product from the screen was collected in a pan. FIG. 7A is an SEM of a field of numerous WC/Al composite particles so prepared and FIG. 7B is a magnified SEM view of the surface of one such particle. FIG. 8 is an X-ray energy dispersive spectrum of the WC/Al particles so prepared. Referring to FIG. 7B, while the refractory material particles (light-shaded areas) are fine in size and tightly packed as compared to those of FIG. 4, the dark-shaded areas correspond to surface areas of the composite which are devoid of and/or have a low concentration of refractory material particles. This is reflected in the X-ray energy dispersive spectrum of FIG. 8. The Al peak is of much greater intensity relative to the W peak than the corresponding Al peak in the spectrum of FIG. 5, indicating that there are areas of the composite shown in FIG. 7B having a lesser degree of refractory particle embedding.

The resulting material had a powder resistivity of 5 ohm-cm. An additional run yielded a composite material with a powder resistivity of 1.8 ohm-cm. For comparison, the same proportions of tungsten carbide and aluminum powders were physically mixed and the resistivity of the resulting mixture was $4 \times 10^7$ ohm-cm, considerably greater than that of the mechanically alloyed composite.

EXAMPLE 4

To prepare an EMI shielding material, 22 grams of General Electric SE6035 silicone gum rubber were added to the head of a Brabender Plasticorder™ equipped with cam blades. Mixing was initiated at 40 RPM after which 77 grams of WC/Al composite particles according to the invention were added. Mixing was continued for five minutes at 40 RPM after which time 2.8 grams of additional silicone gum rubber were added. Mixing was again continued for 10 minutes at 40 RPM. 0.5 grams of Lubersol 101™ was added and mixing continued for five minutes at 40 RPM until a homogenous paste was obtained. Mixing was discontinued, the homogenous paste was discharged from the Brabender mixing head and placed in a mold 4"×6"×0.075" until the mold was filled. The material was then compressed in the mold using a press heated to 175° C. and exerting a pressure of 400 PSI. Constant temperature and pressure were maintained for 15 minutes after which the material was removed from the mold and allowed to cool. The cooled material was then placed in a convection oven for 15 minutes at 156° C. The resulting, rubberized material was then cut into six buttons having a thickness of 0.296 cm and a diameter of 2.261 cm. Each of the six buttons was then placed in a screw-vice and resistivity measurements were taken at various pressures. The results of these measurements are set forth in Table 5.

Another EMI shielding material was prepared in the manner described above from WC/Al filled silicone at 75 wt. % loading of the filler. A button was die cut having a thickness of 0.071" and a diameter of 0.28". The volume resistivity of the button was measured with a resistivity press as described in the literature (10). The resistivity measurements are set forth in Table 6.

To assess the effect of loading of the conductive filler on the resistivity of the silicone shielding material, resistivity measurements were made on silicone compositions loaded with decreasing amounts of WC/Al conductive filler. The resistivity measurements are shown in Table 7. Table 7 indicates that the higher the loading of the WC/Al filler, the lower the resistivity.

TABLE 5

| Sample No. | Light Pressure | ¼ Turn | ½ Turn |
|---|---|---|---|
| 1 | 2.7 Ω | 1.50 Ω | 0.36 Ω |
| 2 | 2.0 Ω | 0.94 Ω | 0.48 Ω |
| 3 | 2.5 Ω | 1.25 Ω | 0.56 Ω |
| 4 | 3.8 Ω | 2.65 Ω | 1.10 Ω |
| 5 | 6.4 Ω | 5.20 Ω | 0.74 Ω |
| 6 | 3.7 Ω | 1.85 Ω | 0.92 Ω |
| Ave. Resistance | 3.5 Ω | 2.20 Ω | 0.69 Ω |
| Ave. Resistivity | 47.5 Ω cm | 29.80 Ω cm | 9.40 Ω cm |

TABLE 6

| PRESSURE (PSI) | RESISTIVITY (ohm-cm) |
|---|---|
| 2 | 0.92 |
| 20 | 0.29 |
| 40 | 0.20 |
| 80 | 0.14 |
| 120 | 0.11 |
| 160 | 0.09 |

TABLE 7

| WC/Al LOADING (wt. %) | RESISTIVITY (Ω-CM) AT 100 PSI |
|---|---|
| 80% | 0.09 |
| 75% | 0.15 |
| 70% | 0.78 |
| 65% | 12.2 |

EXAMPLE 5

In the following example, the corrosion compatibility of electrically conductive compositions containing known conductive powders, in particular Ag/Cu, Ag/Beads, and Ag/Al, was compared with the corrosion compatibility of a composition containing a composite, conductive powder in accordance with the present invention, namely WC/Al. In order to make the comparison, the salt spray test (11) was used.

The salt spray test is an accelerated environmental corrosion test. The samples to be tested are mounted in a specially constructed chamber and subjected to a salt fog of 5% sodium chloride at 35° C. (95° F.) for a specific duration of time. The chamber of the salt fog apparatus is large enough so that the samples are subject to sufficient amounts of fog to insure uniform exposure and corrosivity. Samples are inspected on a daily basis and subjectively rated as to degree of corrosion. Electrical resistivity measurements are performed at regular intervals to determine performance changes of the samples.

Each of the conductive powders to be tested was compounded into silicone rubber as previously described and molded into a thin sheet. A circular shape was die cut from the sheet and sandwiched between a pair of aluminum disks, three inches in diameter. The aluminum disks were bolted together with sufficient pressure to compress the rubber sample to 90% of its initial thickness and in such a manner that the bolts would not affect electrical resistivity measurements across the sandwich. Each of the four sandwiches was placed in the chamber of the salt fog apparatus. Electrical resistivity measurements were made across the sandwich before and after exposure in the salt fog chamber and the samples were assigned a visual corrosion rating on a scale of 1–10, where 10 corresponds to the most severe observed degree of corrosion of the aluminum discs, i.e., 10 is the lowest degree of galvanic compatibility. The results of the test are summarized in Table 8.

Table 8 shows that although the powder resistivity of the Tungsten Carbide/Aluminum (WC/Al) is 8 ohms •cm vs. $10^{-3}$ to $10^{-4}$ for the silver-coated powders, the resistivity drops to an acceptable level when compounded into silicone. The other materials increased in resistivity when compounded. It should be noted that the predicted performance for corrosion resistance for WC/Al is confirmed by experiment in the salt spray test.

TABLE 8

Comparative Resistivity to Corrosion

| Particle | Powder ohm·cm | R Size | Wt. % Leading | Vol. % Leading | Corrosion Rating After 144 hrs. | Initial Resistivity ohm·cm | Resistivity After Salt Spray ohm·cm After 144 hrs. |
|---|---|---|---|---|---|---|---|
| Ag/Cu | $4.5 \times 10^{-4}$ | 45 M | 80 | 35.6 | 9.5 | $2.7 \times 10^{-2}$ | $3.8 \times 10^{-2}$ |
| Ag/Beads | $1.4 \times 10^{-3}$ | 42 M | 70 | 47.8 | 7.5 | $4.4 \times 10^{-2}$ | $1.0 \times 10^{-1}$ |
| Ag/Al | $3.5 \times 10^{-3}$ | 50 M | 73.7 | 50 | 5.0 | $8.1 \times 10^{-2}$ | $3.0 \times 10^{-1}$ |
| WC/Al | 8.0 | 75 M | 75.3 | 50 | 2.5 | $6.2 \times 10^{-1}$ | $7.6 \times 10^{-1}$ |

LIST OF REFERENCES

1. *Conductive Elastomer Gasket Design*, EMI Shielding Engineering Handbook, Chomerics, Inc., Woburn, Mass., 25:25–26 (1985).
2. CRC Handbook Of Chemistry And Physics, 56th Edition (Weast, Ed.), D51–D58 (1975–1976).
3. T. Yokoyama, *Mechanofusion Treatment With Angmill And Its Potential In Industrial Application*, Product Literature from the Micromeritics Laboratory of Hosokowa Micron International, Inc., Summit, N.J.

4. M. Alonso, *Mechanism Of The Combined Coating-Mechanofusion Processing Of Powders*, Powder Technology, 59:45–52 (1989).

5. T. Yokoyama et al., *The Angmill Mechanofusion System And Its Applications*, KONA, No. 5, 59–68 (1987).

6. *A New Method Of Agglomerating Heterogenous Powders*, Particle Fabrication, Product Literature of Bepex Corporation, Minneapolis, Minn.

7. *An Introduction To Powder Modification Technology*, Powder And Bulk Engineering, 50–54 (February, 1990).

8. J. S. Benjamin, *Mechanical Alloying*, Scientific American, 234:40–48 (1976).

9. B. Fultz et al., *Mechanical Alloying Of Fe And V Powders: Intermixing And Amorphous Phase Formation*, J. Mater. Res., 4(6):1450–1455 (1989).

10. Military Specification - Shielding Gasket, Electronic, Elastomer, EMI/RFI, General Specification MIL-G-83528 (Apr. 1, 1988).

11. *Standard Method Of Salt Spray (Fog) Testing*, ASTM Designation:B117-85.

What is claimed is:

1. A composite particle, suitable for incorporation in an electrically conductive composition, said composite particle being galvanically compatible in respect of a metallic material, said particle comprising in combination:
   a) an electrically conductive solid core material which
      i) is metallic and has a metallic analysis substantially the same as said metallic material;
      ii) is substantially electrochemically inert in respect of said metallic material; or
      iii) includes a first portion having a metallic analysis substantially the same as said metallic material and a second portion which is substantially electrochemically inert in respect of said metallic material; and
   b) an electrically conductive material bonded to the core material, which electrically conductive material is substantially inert to participation in or catalysis of cathodic reaction involving the electrochemical reduction of molecular oxygen or water;
   such that the combination of said core material and said electrically conductive material in said composite particle, when incorporated in said electrically conductive composition, is galvanically compatible in respect of said metallic material and wherein, when said core material and said electrically conductive material each has a metallic constituent, the metal of said constituent of the core material is not the same as the metal of the metallic constituent of the electrically conductive material.

2. A composite particle as defined in claim 1, wherein said electrically conductive material is present in an amount such that, when a multiplicity of said composite particles is included in said composition, electrical contact between adjacent particles is not substantially impaired by any formation of electrically insulating oxides on the core material.

3. A composite particle as defined in claim 1, which comprises said core material in particulate form, and said electrically conductive material in the form of a substantially continuous coating on the particulate core material.

4. A particle as defined in claim 1, which comprises said core material in particulate form, and said electrically conductive material in the form of a discontinuous coating covering a sufficient portion of the surface of the particulate core material such that, when a multiplicity of said composite particles is included in said composition, electrical contact between adjacent particles is not substantially impaired by any formation of electrically insulating oxides on the core material.

5. A composite particle as defined in claim 1, wherein the core material is in particulate form, the electrically conductive material is also in particulate form, and the particulate electrically conductive material is bonded to the surface of the particulate core material in an amount such that, when a multiplicity of said composite particles is included in said composition, electrical contact between adjacent particles is not substantially impaired by any formation of electrically insulating oxides on the core material.

6. A composite particle as defined in claim 1, wherein said core material comprises a metal or metal alloy.

7. A composite particle as defined in claim 6, wherein said metal is aluminum, tin, zinc, nickel, cadmium or magnesium.

8. A composite particle as defined in claim 1, wherein said core material comprises a glass.

9. A composite particle as defined in claim 8, wherein said glass is soda lime glass or borosilicate glass.

10. A composite particle as defined in claim 1, wherein said core material is a combination of a metal or a metal alloy and a glass.

11. A composite particle as defined in claim 10, wherein said core material is in particulate form and comprises a glass on which is deposited a metal or metal alloy.

12. A composite particle as defined in claim 11, wherein said core material is glass fiber segments on which tin is deposited.

13. A composite particle as defined in claim 1, wherein said electrically conductive material is a metal, metal alloy, metal carbide, metal sulfide, metal silicide, metal boride, metal nitride, or metal oxide.

14. A composite particle as defined in claim 13, wherein the electrically conductive material is a metal selected from the group consisting of aluminum, tin, zinc, nickel, cadmium, gold and indium.

15. A composite particle as defined in claim 13, wherein the electrically conductive material is a: metal carbide selected from the group consisting of tungsten carbide, niobium carbide, titanium carbide, vanadium carbide, molybdenum carbide, zirconium carbide and boron carbide; metal sulfide selected from the group consisting of copper sulfide, silver sulfide, iron sulfide, nickel sulfide, cobalt sulfide, lead sulfide and zinc sulfide; metal silicide selected from the group consisting of chromium silicide, molybdenum silicide, cobalt silicide, vanadium silicide, tungsten silicide and titanium silicide; metal boride selected from the group consisting of chromium boride, molybdenum boride, titanium boride, zirconium boride, miobium boride and tantalum boride; metal nitride selected from the group consisting of tantalum nitride, titanium nitride, vanadium nitride and zirconium nitride; or metal oxide selected from the group consisting of tin oxide, iron oxide, manganese oxide, copper oxide, lead oxide, ruthenium oxide, chromium oxide, silver oxide and antimony oxide.

16. A composite particle as defined in claim 15, wherein the electrically conductive material is a metal carbide selected from the group consisting of tungsten carbide, niobium carbide, titanium carbide, vanadium carbide, molybdenum carbide, zirconium carbide and boron carbide.

17. A composite particle as defined in claim 13, wherein the core material is in particulate form and has an average particle size of about 0.5 to 200 microns, and the electrically conductive material is a coating of thickness about 50 to 200,000 angstroms, or particles of an average particle size of about 0.005 to 20 microns.

18. A composite particle as defined in claim 1, wherein said core material is present in an amount of about 10 to 99.5 weight percent and said electrically conductive material is present in an amount of from about 90 to 0.5 weight percent.

19. A composite particle as defined in claim 1, wherein the electrically conductive material is bonded to said core material such that it forms a substantially continuous, or discontinuous, layer of thickness sufficient that the formation of any electrically insulating oxides on said core material does not, when a multiplicity of said particles is included in said composition, substantially impair electrical contact between adjacent composite particles.

20. A method for preparing an electrically conductive composition comprising the composite particle as recited in claim 1, which comprises admixing a binder matrix with a plurality of said composite particles so as to disperse said particles throughout said matrix;

such that the composition containing said plurality of composite particles is galvanically compatible in respect of said metallic material and wherein, when said core material and said electrically conductive material each has a metallic constituent, the metal of said constituent of the core material is not the same as the metal of the metallic constituent of the electrically conductive material.

21. A method for providing at a selected surface EMI shielding material or electrostatic charge dissipation material comprising the composite particle as recited in claim 1, which method comprises locating an EMI shielding material or electrostatic charge dissipation material adjacent said surface, said EMI shielding material or electrostatic charge dissipation material comprising in combination:

a binder matrix, and a plurality of said composite particles dispersed throughout said matrix such that the shielding or charge dissipation material containing said plurality of composite particles is galvanically compatible in respect of said metallic material and wherein, when said core material and said electrically conductive material each has a metallic constituent, the metal of said constituent of the core material is not the same as the metal of the metallic constituent of the electrically conductive material.

22. A plurality of composite particles, each of said particles being as defined in claim 1.

23. A method for preparing the composite particle of claim 1 which is galvanically compatible in respect of a metallic material, which comprises contacting the electrically conductive solid core material in particulate form, said core material having a surface oxide layer, with an electrically conductive refractory material in particulate form, under conditions such that said core material and said reactive material are conductively fused.

24. A method as defined in claim 23, wherein the refractory material forms a conductive path through said oxide layer to said core material.

25. A method as defined in claim 23, which further comprises causing said refractory material particles to breach said oxide layer so as to make contact with said core material and to extend outwardly from said oxide layer.

26. A method as defined in claim 23, which comprises embedding said electrically conductive material into said core material.

27. A method according to claim 26, wherein said embedding is carried out by mechanofusion.

28. A method according to claim 26, wherein said embedding is carried out by hybridization.

29. A method according to claim 26, wherein said embedding is carried out by mechanical alloying.

30. A method according to claim 26, wherein said embedding is carried out by ball milling.

31. A method for preparing a composite particle suitable for incorporation in a composition, said composite particle being galvanically compatible in respect of a metallic material, which method comprises contacting (a) an electrically conductive solid core material (i) which is metallic and has a metallic analysis substantially the same as that of said metallic material, (ii) which is substantially electrochemically inert in respect of said metallic material, or (iii) which includes a first portion having a metallic analysis substantially the same as that of said metallic material and a second portion which is substantially electrochemically inert in respect of said metallic material, with (b) an electrically conductive material that is substantially inert to participation in or catalysis of cathodic reaction involving the electrochemical reduction of molecular oxygen or water, said contact being effected under conditions such that said core material and said electrically conductive material are bonded;

such that the combination of said core material and said electrically conductive material in said composite particle, when incorporated in said composition, is galvanically compatible in respect of said metallic material and wherein, when said core material and said electrically conductive material each has a metallic constituent, the metal of said constituent of the core material is not the same as the metal of the metallic constituent of the electrically conductive material.

32. A method as defined in claim 31, which comprises conductively bonding the electrically conductive material to the core material.

33. A method as defined in claim 31, which comprises bonding the electrically conductive material to the core material in the form of a coating of thickness sufficient that the formation of any electrically insulating oxides on the core material does not, when multiplicity of said composite particles is included in said composition, substantially impair electrical contact between adjacent composite particles.

34. A method as defined in claim 31, which comprises treating the particle at a pressure which assists in the formation of the electrically conductive material.

35. A method as defined in claim 31, which comprises depositing the electrically conductive material on the core material by chemical vapor deposition.

36. A method as defined in claim 35, which comprises depositing the electrically conductive material on the core material by chemical vapor deposition, said core material being in particulate form, and being substantially free of oxides.

37. A method as defined in claim 36, which comprises atomizing molten metal or metal alloy core material to obtain multiple core material particles, under inert conditions such that said particles are substantially oxide-free, and depositing the electrically conductive material on said multiple particles by chemical vapor deposition.

38. A method as defined in claim 37, wherein the core material is aluminum and the electrically conductive material is cobalt silicide, tungsten carbide or a metal sulfide.

39. A method as defined in claim 31, which comprises forming a coating of electrically conductive material on said core material by wet chemical conversion.

40. A method as defined in claim 31, which comprises solvent coating or film forming an inherently conductive polymer on said core material.

41. A method as defined in claim 31, which comprises depositing a sol gel on the particulate core material, and coalescing the gel to form a coating of electrically conductive material on the core material.

42. A method as defined in claim 31, which comprises depositing the electrically conductive material on the core material by electroless plating.

43. A method as defined in claim 31, which comprises electroless plating the electrically conductive material onto the core material in particulate form.

44. A method as defined in claim 43, which comprises electroless plating of gold or indium onto aluminum.

45. A method as defined in claim 31, which comprises depositing the electrically conductive material on the core material by electrolytic plating.

46. A method as defined in claim 45, which comprises depositing the electrically conductive material on the core material in particulate form.

47. A method as defined in claim 46, which comprises electrolytically plating gold or indium on aluminum.

48. A method as defined in claim 31, which comprises atomizing a molten mixture of said core material and said electrically conductive material or a component thereof to obtain particles of said molten mixture, and thermally treating the particles in a controlled atmosphere such that the electrically conductive material or component thereof diffuses to the surface of such particles and forms a coating of electrically conductive material.

49. A method as defined in claim 48, which includes subjecting the particles to a thermal treatment comprising maintaining the particles at a temperature of at least 200° C. but less than the melting temperature of the particles, for a time of 2–24 hours.

50. A method as defined in claim 31, which comprises conducting said thermal treatment in an atmosphere which is inert, reducing, or reacts with said component to form the electrically conductive material on the core material.

* * * * *